United States Patent
Glazunov et al.

(10) Patent No.: US 10,505,101 B2
(45) Date of Patent: *Dec. 10, 2019

(54) CERAMIC MATERIAL, METHOD FOR PRODUCING THE CERAMIC MATERIAL, AND ELECTROCERAMIC COMPONENT COMPRISING THE CERAMIC MATERIAL

(71) Applicant: TDK Electronics AG, Munich (DE)

(72) Inventors: Alexander Glazunov, Deutschlandsberg (AT); Adalbert Feltz, Deutschlandsberg (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/705,199

(22) Filed: Sep. 14, 2017

(65) Prior Publication Data

US 2018/0006210 A1 Jan. 4, 2018

Related U.S. Application Data

(62) Division of application No. 14/356,147, filed as application No. PCT/EP2012/071081 on Oct. 24, 2012, now Pat. No. 9,780,296.

(30) Foreign Application Priority Data

Nov. 4, 2011 (DE) .................. 10 2011 117 709

(51) Int. Cl.
*H01L 41/43* (2013.01)
*H01L 41/083* (2006.01)
(Continued)

(52) U.S. Cl.
CPC ............ *H01L 41/43* (2013.01); *C04B 35/491* (2013.01); *C04B 35/6262* (2013.01);
(Continued)

(58) Field of Classification Search
CPC .... H01L 41/083; H01L 41/1876; H01L 41/43
(Continued)

(56) References Cited

U.S. PATENT DOCUMENTS 7,579,756 B2 * 8/2009 Althoff ................. H01L 41/083
310/328
7,855,488 B2 * 12/2010 Feltz ..................... C04B 35/493
310/328
(Continued)

FOREIGN PATENT DOCUMENTS

CN 1409876 A 4/2003
DE 2904621 A1 8/1979
(Continued)

OTHER PUBLICATIONS

Hizerby, A., "Effect of Nb and K doping on the crack propagation behavior of lead zirconate titanate ceramics", Journal of the European Ceramic Society, vol. 27, pp. 557-560, 2007.

*Primary Examiner* — Thomas M Dougherty
*Assistant Examiner* — Karen B Addison
(74) *Attorney, Agent, or Firm* — Morgan, Lewis & Bockius LLP

(57) ABSTRACT

The invention relates to a ceramic material, comprising lead zirconate titanate, which additionally contains K and optionally Cu. The ceramic material can be used in an electroceramic component, for example a piezoelectric actuator. The invention also relates to methods for producing the ceramic material and the electronic component.

15 Claims, 3 Drawing Sheets

(51) Int. Cl.
*H01L 41/273* (2013.01)
*C04B 35/491* (2006.01)
*C04B 35/626* (2006.01)
*C04B 35/634* (2006.01)
*C04B 35/638* (2006.01)
*H01L 41/187* (2006.01)

(52) U.S. Cl.
CPC .. *C04B 35/62655* (2013.01); *C04B 35/62685* (2013.01); *C04B 35/638* (2013.01); *C04B 35/63456* (2013.01); *H01L 41/083* (2013.01); *H01L 41/1873* (2013.01); *H01L 41/1876* (2013.01); *H01L 41/273* (2013.01); *C04B 2235/3201* (2013.01); *C04B 2235/3224* (2013.01); *C04B 2235/3279* (2013.01); *C04B 2235/3281* (2013.01); *C04B 2235/442* (2013.01); *C04B 2235/449* (2013.01); *C04B 2235/5445* (2013.01); *C04B 2235/6025* (2013.01); *C04B 2235/6562* (2013.01); *C04B 2235/6567* (2013.01); *C04B 2235/768* (2013.01)

(58) Field of Classification Search
USPC .... 310/358, 363–366, 311, 328; 252/62.9 R, 252/62.9 PZ
See application file for complete search history.

(56) References Cited

U.S. PATENT DOCUMENTS

| | | | |
|---|---|---|---|
| 9,570,669 B2* | 2/2017 | Glazunov | C04B 35/493 |
| 9,780,296 B2* | 10/2017 | Glazunov | C04B 35/491 |
| 2007/0125977 A1 | 6/2007 | Kawamoto et al. | |
| 2011/0259502 A1 | 10/2011 | Schossmann et al. | |

FOREIGN PATENT DOCUMENTS

| | | |
|---|---|---|
| DE | 10062672 A1 | 8/2001 |
| DE | 10345499 A1 | 4/2005 |
| DE | 102007045089 A1 | 3/2009 |
| EP | 1240675 A2 | 9/2002 |
| GB | 2023567 A | 1/1980 |
| JP | 2003201175 A | 7/2003 |
| JP | 2003529917 A | 10/2003 |
| JP | 2006265071 A | 10/2006 |
| JP | 2007-507406 A | 3/2007 |
| JP | 2007150350 A | 6/2007 |
| JP | 2007204346 A | 8/2007 |
| JP | 2010537937 A | 12/2010 |
| WO | WO-0145138 A2 | 6/2001 |
| WO | WO-2005034256 A2 | 4/2005 |

\* cited by examiner

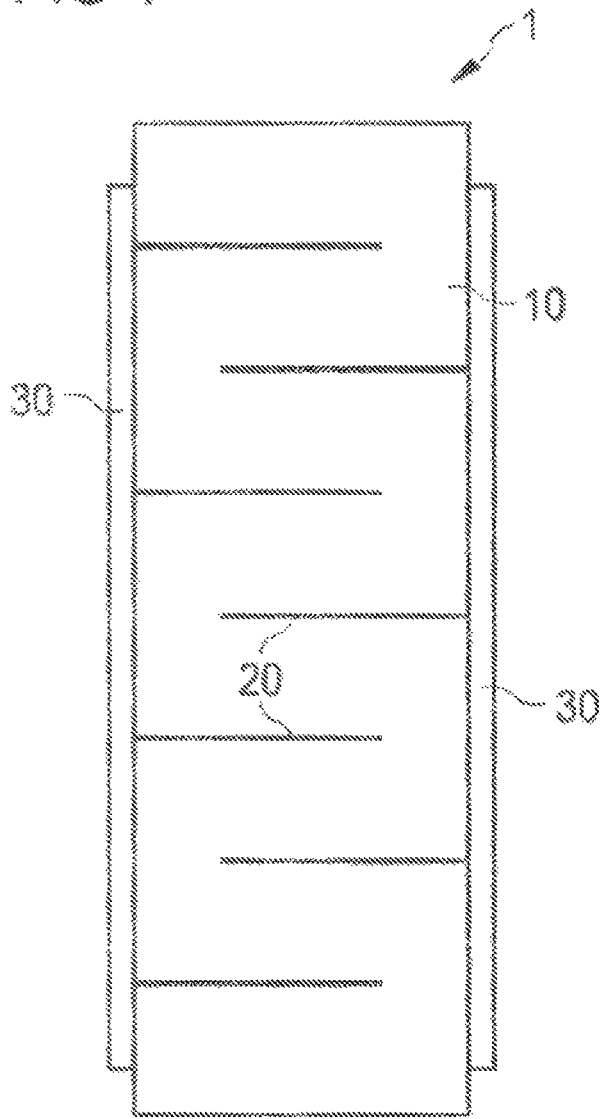

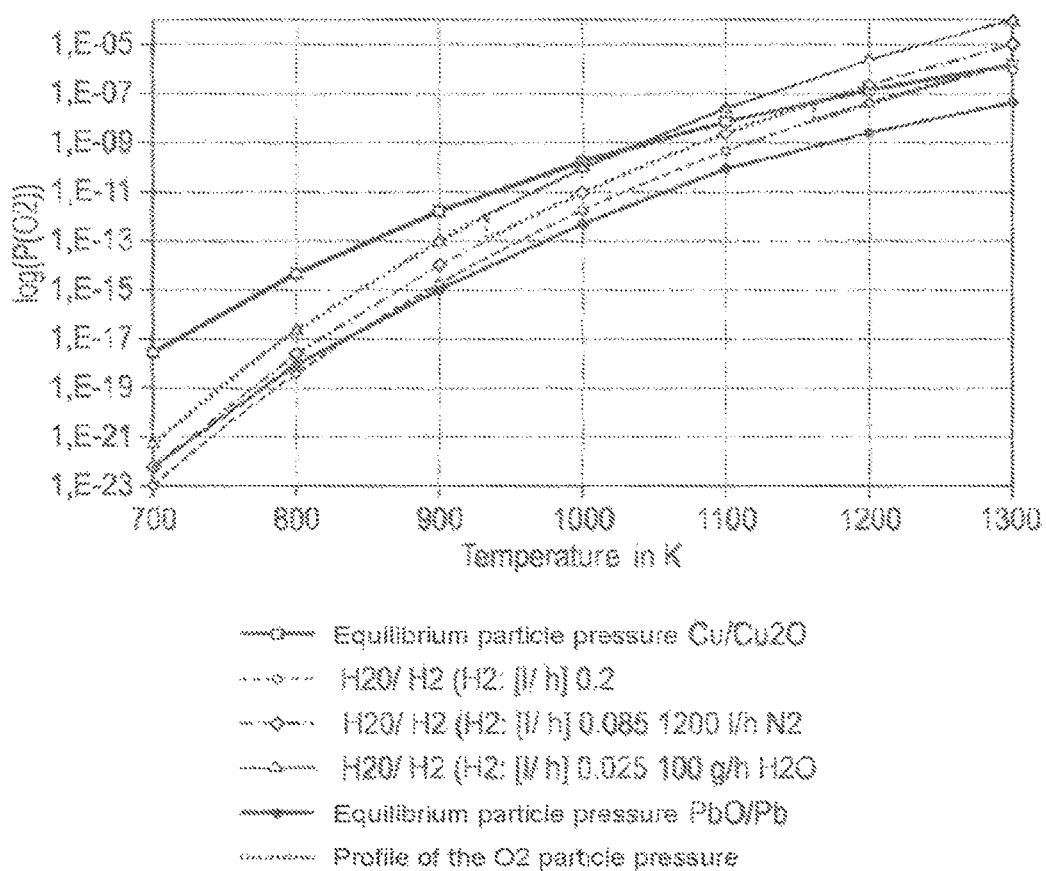

20μm

CERAMIC MATERIAL, METHOD FOR PRODUCING THE CERAMIC MATERIAL, AND ELECTROCERAMIC COMPONENT COMPRISING THE CERAMIC MATERIAL

CROSS-REFERENCE TO RELATED APPLICATIONS

The present application is a divisional application of U.S. patent application Ser. No. 14/356,147 entitled "CERAMIC MATERIAL, METHOD FOR PRODUCING THE CERAMIC MATERIAL, AND ELECTROCERAMIC COMPONENT COMPRISING THE CERAMIC MATERIAL," filed on May 2, 2014, which is the national stage of entry of International Patent Application No. PCT/EP2012/071081, filed on Oct. 24, 2012, which claims the benefit of priority under 35 U.S.C. § 119 of German Patent Application 102011117709.8 filed on Nov. 4, 2011, all of which are hereby incorporated by reference in their entirety for all purposes.

DESCRIPTION

The invention provides a ceramic material, comprising lead zirconate titanate, which additionally contains K and optionally Cu.

An essential prerequisite for the performance of lead zirconate titanate materials are the adaptation of the composition to the morphotropic phase boundary (MPB), sufficient grain growth and the adaptation of the sintering temperature to the electrode material used.

It is an object of the invention to provide a ceramic material with an improved performance for electroceramic components.

The object is achieved by a ceramic material according to claim 1. Further embodiments of the ceramic material and also a method for producing the ceramic material and electroceramic components comprising the ceramic material are the subject matter of further patent claims. The method for producing a multilayer component is furthermore claimed in an independent claim.

The object described is achieved by the addition of K and optionally Cu to a ceramic material comprising lead zirconate titanate.

The addition of K and optionally Cu to the lead zirconate titanate makes it possible for the grain size of the ceramic to be controlled during production. The grain size has a direct relationship with the piezoelectric properties of the ceramic.

The composition can be adapted to the MPB by suitable selection of the zirconate titanate proportion in the ceramic.

The mechanical stresses in a lead zirconate titanate ceramic (PZT ceramic) result from the ferroelectric phase transition characteristic of this material, this taking place upon cooling in the region of approximately 330° C., what is termed the Curie temperature (TC. This consists in a tetragonal and, in the region of the morphological phase boundary (MPB), at the same time also in part rhombohedral distortion of the cubic structure present above $T_C$. For the purpose of minimizing the local mechanical stresses resulting therefrom, each crystal grain of the ceramic is broken up into domains. These comprise approximately $10^9$ elementary cells. These are areas with the same alignment of the tetragonal or rhombohedral (polar) axis which preferably border one another at an angle of 90° and therefore form what are termed domain walls. When the polar axis is aligned in an applied electric field, the domain walls are shifted, and this movement is inhibited inter alia by the grain boundaries in the microstructure of the ceramic. The density of the grain boundaries in the volume of the ceramic is all the lower, the greater the mean grain diameter. Consequently, sufficient grain growth is required primarily for ensuring sufficient domain wall mobility and therefore for achieving a high performance of the PZT ceramic.

The lead zirconate titanate ceramic has a perovskite lattice which can be described by the general formula $ABO_3$, wherein A represents the A sites and B represents the B sites of the perovskite lattice.

An elementary cell of the PZT crystal lattice can be described by a cube. The A sites are occupied by $Pb^{2+}$ ions, which lie at the corners of the cube. An $O^{2-}$ ion lies in the middle of each cube face. There is a $Ti^{4+}$ ion or a $Zr^{4+}$ ion at the center of the cube. This structure has a high tolerance in relation to the substitution of the metal ions by other metal ions and vacancies. Doping is thereby possible within relatively wide limits.

Depending on the size difference between the ion introduced by doping and the replaced ion, additional local distortion in the coordination polyhedron can occur.

The various possibilities for the doping can be classified on the basis of the valency of the doping ion. Isovalent doping, i.e. the replacement of one ion by another ion with the same valency, does not affect possible vacancies in the ceramic material. If low-valency cations (acceptors) replace cations with a higher valency, vacancies will be produced in the anion lattice. Higher-valency cations (donors) cause vacancies in the cation lattice when they replace lower-valency cations. Doping with acceptors and donors respectively leads to characteristic changes in the material properties.

In one exemplary embodiment of the invention, Nd, K and optionally Cu occupy A sites in the perovskite lattice.

Doping with $Nd^{3+}$ on the A sites represents donor doping. On account of the ion radius of neodymium, this is incorporated on the $Pb^{2+}$ sites and symbolized by Nd. on account of the excess charge. The charge equilibration is effected by the corresponding formation of Pb vacancies ($V_{Pb}$"). The doping leads to metric changes in the lattice and influences further-reaching interactions between the elementary cells.

Doping with $K^+$ on the A sites, and therefore instead of $Pb^{2+}$, represents acceptor doping. Since a positive charge is now absent at the lattice site, a negative excess charge acts on the lattice environment in the case of this defect. It is therefore symbolized by K'. This acceptor doping is compensated for by the $Nd^{3+}$ donor doping with a positive excess charge, symbolized by Nd., which is always greater than the acceptor doping, and therefore neutral [K'/Nd.] defect pairs form. This means that the concentration of the vacancies $V_{Pb}$" is reduced by the acceptor doping; this is because only the excess proportion of the donor doping contributes to the formation thereof. The defect pairs dissociate at the sintering temperature. In this process, 2 Nd. defects induce the formation of a $V_{Pb}$" vacancy and the 2 K' defects induce the formation of an oxygen vacancy $V_O$", and the latter are particularly beneficial for the grain growth and the sintering compaction. In the cooling process, recombination is effected to give the again effectively neutral [K'/Nd.] defect pairs, such that no or only a very small oxygen vacancy concentration is present in the finished ceramic. By contrast, lead vacancies are still present in accordance with the excess from the donor doping.

This doping has an effect on the grain growth of the material, which is dependent on the concentration of the doping introduced. Small doping quantities contribute in this respect to the grain growth, whereas excessive quantities of doping ions can inhibit the grain growth.

On account of the formation of Pb vacancies $V_{Pb}''$, donor doping with Nd. increases the domain wall mobility and therefore the alignability of the domains in the applied electric field, and this can lead to high values for the dielectric polarization. On the other hand, as a consequence of the suppression of the formation of oxygen vacancies, the donor doping has the effect that inhibition of the growth of the crystallites becomes effective, and therefore, as a consequence of the relatively high density of grain boundaries in the ceramic, the mobility of the domain walls is increasingly limited with increasing donor doping, this leading to an opposed tendency in the alignability of the domains in the applied electric field and therefore to a reduction in the remanent polarization, i.e. the polarization which remains when the electric field is switched off, and to a decrease in the coupling factor. As a result of additional doping by means of acceptors, the positive action of the donors is in part weakened, but the negative action is largely nullified, in that the formation of oxygen vacancies linked to the acceptor doping promotes the grain growth at the sintering temperature, and therefore the easy displaceability of the domain walls is retained, leading to higher dielectric constants, piezoelectric constants and higher coupling factors.

The combination of acceptor and donor doping present according to the invention has the effect that the negative properties which arise when the ceramic has been doped with only one of the two doping types are compensated for. If only acceptor doping were to be present, for example, this often leads to decreasing dielectric and piezoelectric constants and a decreasing coupling factor, that is to say the constants lie below those of the undoped ceramic. If only donor doping is present, the grain growth is inhibited and the grains of the ceramic do not reach the desired size. However, the doping combination which is present according to the invention stands out positively from the undoped ceramic in these aspects. It has both better piezoelectric constants and better grain growth, which is also achieved at lower temperatures than in the case of undoped PZT ceramics.

In small-grain materials, the domain boundaries are often located on the grain boundaries and thus cannot contribute to the piezoelectric properties because they are fixed on these grain boundaries. The internal stress can affect the structure of the crystal lattice and the stability of phases. Therefore, it is desirable to be able to control the grain growth in a targeted manner. This is intended to be done inter alia by way of doping the PZT ceramic.

According to a preferred embodiment, the ceramic material has a composition according to the following formula:

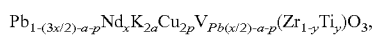
$$Pb_{1-(3x/2)-a-p}Nd_xK_{2a}Cu_{2p}V_{Pb(x/2)-a-p}(Zr_{1-y}Ti_y)O_3,$$

within the limits $0.0001 \leq x \leq 0.06$, $0.0001 \leq a \leq 0.03$, $0.35 \leq y \leq 0.60$ and $0<p<((x/2)-a)$, preferably in the composition range $0.015 \leq x \leq 0.025$, $0.002 \leq a \leq 0.0125$, $0.45 \leq y \leq 0.55$ and $0<p<((x/2)-a)$, in which $V_{Pb}$ represents a lead vacancy.

According to a further preferred embodiment, the ceramic material has a composition according to the following formula:

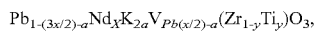
$$Pb_{1-(3x/2)-a}Nd_xK_{2a}V_{Pb(x/2)-a}(Zr_{1-y}Ti_y)O_3,$$

within the limits $0.0001 \leq x \leq 0.06$, $0.0001 \leq a \leq 0.03$, $0.35 \leq y \leq 0.60$, preferably in the composition range $0.015 \leq x \leq 0.025$, $0.002 \leq a \leq 0.0125$, $0.45 \leq y \leq 0.55$, in which $V_{Pb}$ represents a lead vacancy.

Embodiments of the invention can be produced for use as sensors or actuators in various geometries. For technological reasons, particular features arise in the microstructure during production, for example different grain sizes or different phase boundaries. Since these parameters have an effect on the properties of a ferroelectric material, however, it is desirable to adapt these parameters accordingly to the composition of the morphotropic phase boundary (MPB). For the MPB, the coexistence of the rhombohedral phase beside the tetragonal phase in particular is of interest. In one embodiment of the ceramic according to the invention, adaptation of the composition to the MPB is possible by way of the index y, via which the Ti—Zr ratio can be controlled.

One embodiment of the invention is a piezoelectric actuator. In a preferred embodiment, this comprises at least two layers of the PZT ceramic material doped with Nd, K and optionally Cu and an inner electrode present therebetween. This inner electrode can be produced, for example, from Cu, Pd, Ag or an alloy of these metals. The inner electrode preferably consists of Cu.

The incorporation of K and optionally Cu into the PZT lattice can reduce or even prevent the reaction between the piezoelectric ceramic and the metal of the inner electrode, which takes place during the sintering process at high temperatures. Take, for example, an actuator which has a Cu inner electrode and is made of a ceramic material which has not been doped with K and optionally with Cu, according to the formula

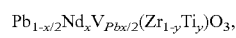
$$Pb_{1-x/2}Nd_xV_{Pbx/2}(Zr_{1-y}Ti_y)O_3,$$

where $0.0001 \leq x \leq 0.06$, $0.45 \leq Y \leq 0.55$ and $V_{Pb}$ represents a Pb vacancy. The vacancy concentration resulting from the different charge of Pb and Nd, 2+ compared with 3+, allows for the diffusion of Cu ions from the inner electrodes into the ceramic, where the Cu ions become incorporated into the crystal lattice. In one embodiment of the invention, this problem is reduced or resolved by the incorporation of $K^+$ and optionally $Cu^+$ ions on A sites of the crystal lattice. The associated compensation for the Pb vacancies ($V_{Pb}$) on the A sites reduces the tendency of the copper to diffuse from the inner electrodes into the ceramic, this reducing or even entirely preventing migration of the Cu ions.

Entirely or partially prevented diffusion of the Cu ions has various advantages for the electroceramic components which are produced from the ceramics according to the invention. Specifically, in this case the inner electrodes do not shed any material and can form a continuous layer, which ensures better conductivity of the inner electrodes.

The transition region between the tetragonal and rhombohedral phases is particularly important in the embodiments of the ceramic. In it, concentration-dependent transformation between two crystal structures in the ceramic material takes place. According to Jaffe, such a phase boundary is referred to as "morphotropic". The material properties exhibit some particular features in this region, and therefore these are of particular interest for the technical application. Some material constants which crucially influence the piezoelectric behavior of the PZT ceramic exhibit good values, for example pronounced maxima, at the morphotropic phase boundary, for example the dielectric constant $\varepsilon_r$, the piezoelectric charge constant $d_{33}$ and the coupling factor k.

The relative dielectric constant $\varepsilon_r$ is the ratio between the absolute permittivity of the ceramic material and the permittivity in a vacuum, the absolute permittivity representing a measure of the polarizability in an electric field. The efficacy of the piezo effect is characterized by the piezoelectric charge constant $d_{ij}$, which represents the ratio of the mechanical deformation to the applied field strength or the ratio of the surface charge density to the applied mechanical stress. The direction dependency of the parameter is specified by the corresponding indices. The index i of the piezoelectric charge constant indicates the direction of the electric field, and the index j indicates the direction of the deformation by which the crystal reacts to the field. Here, 1 stands for the x direction, 2 for the y direction and 3 for the z direction. The piezoelectric charge constant $d_{33}$ therefore denotes the longitudinal expansion behavior in the direction of the z axis. The coupling factor k is a measure of the degree of the piezoelectric effect. It describes the ability of a piezoelectric material to convert absorbed electrical energy into mechanical energy, and vice versa. Here, $k_{33}$ stands for the coupling factor of the longitudinal oscillation. For the longitudinal effect, the polar axis of the crystal is collinear with the deformation direction.

If the piezoelectric charge constant $d_{33}$ of the only Nd-doped ceramic

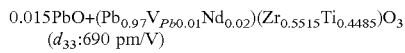
$$0.015PbO+(Pb_{0.97}V_{Pb0.01}Nd_{0.02})(Zr_{0.5515}Ti_{0.4485})O_3$$
$$(d_{33}: 690 \text{ pm/V})$$

is compared with the corresponding exemplary embodiment of a reference ceramic which additionally comprises Ni,

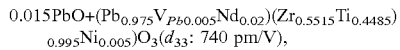
$$0.015PbO+(Pb_{0.975}V_{Pb0.005}Nd_{0.02})(Zr_{0.5515}Ti_{0.4485})$$
$$_{0.995}Ni_{0.005})O_3 (d_{33}: 740 \text{ pm/V}),$$

a significant increase in the value can be seen, which means greater expansion for the same applied voltage. A further improvement is achieved by the PZT ceramic according to the invention with Nd, K and optionally Cu doping. By way of example, the deflection parameter $d_{33}$ is increased by 33% compared to the Ni-doped PZT reference ceramic (see table 1 shown in the exemplary embodiments hereinbelow). The improved piezoelectric properties therefore increase the efficiency of the corresponding exemplary embodiments, in which this ceramic is used.

The coexistence of the rhombohedral and tetragonal phases is taken as the cause of the maxima in the physical properties at the MPB. This coexistence favors the alignment of domains in the electric field and thus improves the polarizability of the ceramic. This further underlines the importance and special status of the MPB in the PZT ceramic.

On account of the good piezoelectric properties, embodiments of the ceramic material according to the invention are suitable for use in, for example, multilayer components.

If a plurality of ceramic layers and inner electrodes are arranged alternately one on top of another, a piezoelectric multilayer component is obtained. In this context, the term alternately is intended to mean that a particular number of ceramic layers is always followed by an inner electrode.

A method for producing the ceramic material is also the subject matter of further embodiments of the invention.

The method for producing the ceramic material comprises the following steps:
A1) producing a ceramic raw material mixture by comminuting and mixing starting materials containing Pb, Zr, Ti, Nd and oxygen, B1) introducing a K-containing compound and optionally introducing Cu or a Cu-containing compound, C1) calcining the raw material mixture, and D1) sintering to form the ceramic.

In a preferred embodiment, a first ceramic raw mass is produced by mixing starting compounds containing Pb, Nd, Zr, Ti and O and subjecting these to a first calcining step A11) at a temperature of, for example, between 850 and 970° C., preferably between 875 and 925° C. The comminution of this calcined ceramic raw mass is then either followed directly by method step C1), or step B1) is carried out before step C1), that is to say a K-containing compound and optionally Cu or a Cu-containing compound are introduced. By inserting step A11), it is possible to obtain a more complete transformation and accordingly a more homogeneous ceramic material.

Here, the starting materials may be present as oxides. The starting materials may however also be present in the form of for example metal carbonates, metal hydrogen carbonates or organometallic compounds or a mixture thereof.

The elements Zr and Ti may also be used in the form of a precursor such as $(Zr,Ti)O_2$ as a starting material.

The elements Pb, Zr, Ti and Nd in their corresponding starting compounds are mixed according to the stoichiometric ratios of the elements in the ceramic material to be produced.

Nd is generally added in a range of from 0.01 to 6 mol %, preferably in the range of from 0.5 to 3 mol % and particularly preferably in the range of from 1.5 to 2.5 mol %.

A K-containing compound can be introduced both before or else only after the calcining (method step C1)). It is preferable to use $K_2CO_3$, $KOOCCH_3$, $K_2C_2O_4$ or a mixture thereof as the K-containing compound.

Cu can be introduced as a Cu metal or as a Cu compound, preferably $Cu_2O$. Cu is preferably added after step C1) and before step D1). It is moreover particularly preferable to add a sintering aid, preferably PbO. If PbO is added, it is preferably added in a quantity of up to 1.5 mol %.

K and optionally Cu are each generally added in a range of from 0.01 to 6 mol %, preferably in the range of from 0.4 to 3 mol % and particularly preferably in the range of from 0.4 to 2.5 mol %. In this respect, the K-containing compound and optionally Cu or the Cu-containing compound are likewise added according to the stoichiometric ratio of K and, respectively, Cu in relation to the other elements in the ceramic material to be produced.

The ceramic raw material mixture is calcined in method step C1) at a temperature which lies for example between 850 and 970° C., preferably between 900 and 950° C. This allows the ceramic to form solid solution phases.

The ceramic, referred to as "raw" or else as "green", is sintered in method step D1). Here, the sintering temperature lies for example between 950 and 1070° C. It is therefore lower than the melting point of copper (1083° C.), which allows the inner electrodes of a piezoelectric actuator to be produced for example entirely from copper, or from alloys whose melting point lies in the copper range.

For shaping, the solid solution phase resulting from the calcining may be ground again in an additional intermediate method step and converted into a ceramic mass by adding a binder. This can then be put into the desired shape, for example green sheets. Since the binder is not desired in the end product, it should be thermally or hydrothermally degradable. For example, binders based on polyurethane are suitable for this. However, the binder has to be removed in an upstream thermal process before sintering, since otherwise degradation of the ceramic because of reduction to form metallic lead is established during sintering.

A method for producing a multilayer component which comprises the ceramic according to the invention is furthermore claimed.

The method for producing the multilayer component comprises the following method steps: A2) providing ceramic green sheets produced by one of the above-described methods, B2) layering the ceramic green sheets on top of one another to form a stack, C2) consolidating the stack by lamination, as a result of which green parts are formed, D2) debindering the green parts, and E2) sintering the green parts.

The ceramic green sheets in this case already contain starting materials containing Pb, Zr, Ti, Nd, oxygen, K and optionally Cu.

The lamination in method step C2) may, for example, be carried out with a pressing force of from 100 to 130 tonnes. The pressing force may be adapted here to the type of binder.

The debindering in method step D2) may be carried out under an inert atmosphere at 550° C., which would for example be preferred conditions for copper inner electrodes. In the absence of Cu inner electrodes, the debindering may, however, also be carried out under an air atmosphere. Here, for example, the temperature is adapted to the binder material and the material of the inner electrodes.

The sintering in method step E2) may, for example, be carried out for 4 hours at a temperature of up to 1070° C. One possible sintering temperature range covers from 960 to 1100° C., although higher temperatures may also be successful. However, the range of from 980 to 1040° C. is preferred.

For the sintering in method step E2), it is possible to use a gas mixture which comprises nitrogen, hydrogen and steam.

If the multilayer component comprises inner electrodes, the material for the inner electrodes may be applied onto the green sheets, for example by printing, between method steps A2) and B2).

A further method for producing a multilayer component is furthermore claimed, during the production of which a further embodiment of the ceramic is formed.

This further production method comprises the following method steps:

A3) producing a first ceramic raw material mixture by comminuting and mixing starting materials containing Pb, Zr, Ti, Nd and oxygen,
B3) calcining the first ceramic raw material mixture,
C3) comminuting the calcined first ceramic raw material mixture and mixing with a K-containing compound to produce a second ceramic raw material mixture,
D3) calcining the second ceramic raw material mixture,
E3) adding a binder to the ceramic raw material mixture of D3),
F3) forming green sheets from the mixture of E3),
G3) printing inner electrodes on the green sheets of F3, the material of the inner electrodes comprising Cu,
H3) layering a multiplicity of the ceramic green sheets of G3) on top of one another to form a stack,
I3) consolidating the stack by lamination, as a result of which green parts are formed,
J3) debindering the green parts,
K3) sintering the green parts, some of the Cu being transferred from the inner electrodes into the ceramic material and being incorporated therein.

Here, green sheets according to F3), i.e. green sheets on which electrode material has not been printed, may also be layered between the green sheets of G3) in method step H3).

Method step E3) may comprise a polyurethane binder, which may be thermally or hydrothermally degradable.

The material of the inner electrodes may comprise metallic Cu or Cu oxide. By printing on the green sheets in method step G3), the Cu ions already have the opportunity to diffuse into the ceramic material.

The lamination in method step H3) may be carried out with a pressing force of from 100 to 130 tonnes. The pressure leads to the formation of green parts.

The debindering in method step J3) may be carried out under an inert atmosphere or air atmosphere at 550° C. In this method step, the temperature must be selected so that the undesired, often organic constituents, which have been introduced inter alia by the binder, are burnt out. The debindering temperature is therefore preferably adapted to the type of binder. However, the material of the inner electrodes also plays a role in the selection of the debindering temperature. The heat treatment can also contribute to the diffusion of Cu out of the electrode material into the ceramic.

The sintering in method step K3) may be carried out for 4 hours at a temperature of up to 1070° C. One possible sintering temperature range covers from 960 to 1100° C., the range of from 980 to 1040° C. being preferred, although temperatures of more than 1100° C. may also lead to the desired result.

For the sintering in method step K3), it is possible to use a gas mixture which comprises nitrogen, hydrogen and steam. During the sintering process, Cu ions migrate out of the inner electrode material into the ceramic, where they are then incorporated on A sites.

The multilayer component may be ground and polished in further steps. Contacting, for example with a copper paste, may be carried out in the region where the inner electrodes emerge. After the paste has been burnt in, the multilayer component may then be provided with wires by means of the conventional bonding technology. This therefore results in a piezoelectric actuator.

The invention is not restricted by the description with reference to the exemplary embodiments. Rather, the invention comprises any new feature and any combination of features, which includes in particular any combination of features in the patent claims, even if this feature or this combination per se is not explicitly referred to in the patent claims or exemplary embodiments.

FIG. 1 schematically shows the structure of a PZT multilayer component (1) having Cu inner electrodes (20), ceramic layers (10) and outer contacts (30).

FIG. 2 shows the process window with the equilibrium lines for $Cu_2O/Cu$ and $PbTiO_3/Pb$, $TiO_2$. It is permissible for the oxygen partial pressure to vary only within these limits, when oxidation of Cu to form $Cu_2O$ or reduction of $PbTiO_3$ to form Pb and $TiO_2$ are to be avoided.

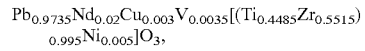

$Pb_{0.9735}Nd_{0.02}Cu_{0.003}V_{0.0035}[(Ti_{0.4485}Zr_{0.5515})_{0.995}Ni_{0.005}]O_3,$ in which, in addition to Nd donors, Cu acceptors are incorporated on the A sites and at the same time Ni acceptors are incorporated on the B sites.

Figure 3A:
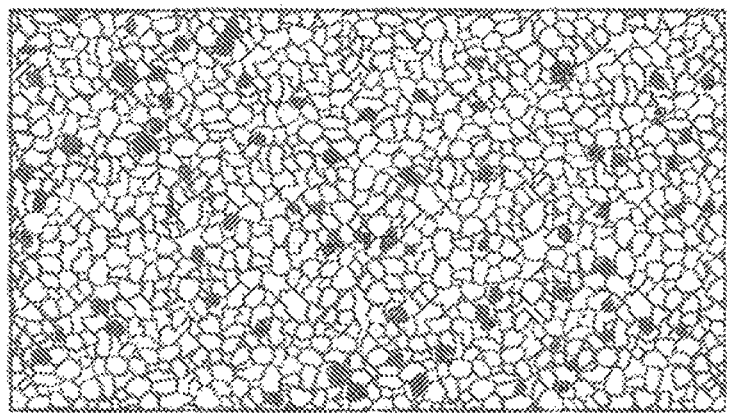
FIG. 3A shows the ceramic microstructure which is obtained in actuators with combined Nd/K, Cu doping on the A sites of the PZT perovskite structure.
Figure 3B:
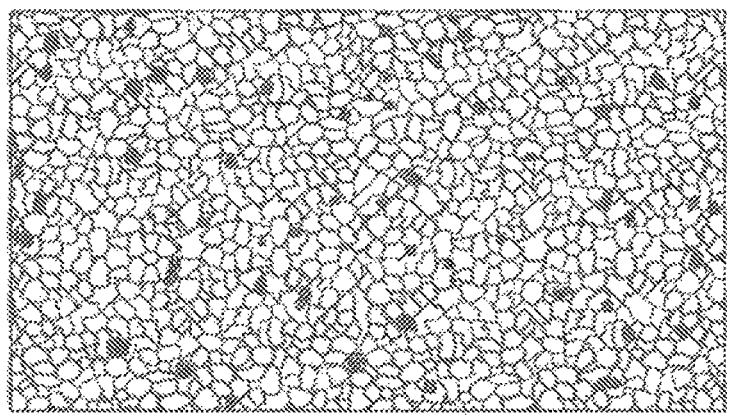
FIG. 3B shows the microstructure of actuators having the ceramic composition
Figure 3C:
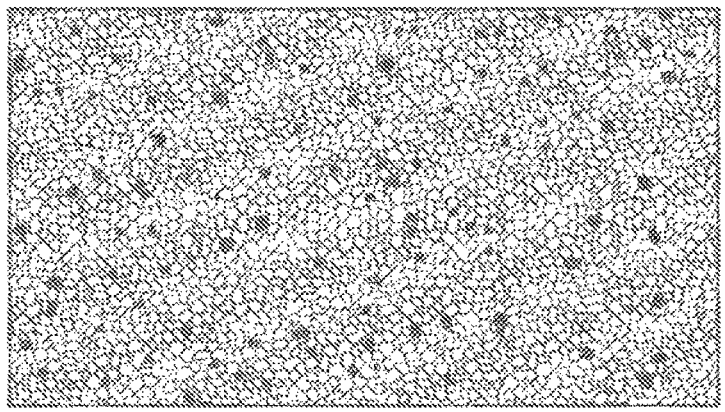

FIG. 3C reproduces the microstructure of ceramic layers in actuators having the ceramic composition

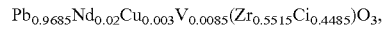

$Pb_{0.9685}Nd_{0.02}Cu_{0.003}V_{0.0085}(Zr_{0.5515}Ti_{0.4485})O_3,$ which, in addition to the Nd/Cu doping, has no further additional doping by K acceptors on A sites or Ni acceptors on B sites.

In a preferred embodiment, starting compounds containing Pb, Ti, Zr and Nd, for example the oxide components $Pb_3O_4$, $TiO_2$, $ZrO_2$ and $Nd_2O_3$, according to the Nd-doped PZT composition

$Pb_{1-(3x/2)}Nd_xV_{x/2}(Zr_{1-y}Ti_y)O_3$ in a mixture with the limits $0.35 \leq y \leq 0.60$ and $0.0001 \leq x \leq 0.06$ and preferably with the limits $0.45 \leq y \leq 0.55$ and $0.015 \leq x \leq 0.025$, are subjected to a first reaction, for example at 925° C. for two hours.

In a version A, the reaction product is milled to $d_{50} \leq 1$ μm in an aqueous slurry and, after drying by evaporation of the water, is reacted a second time, for example at 950° C. for 2 h, for the purpose of better homogenization of the constituents in the PZT perovskite structure. Up to 1.5 mol % PbO based on the PZT formula unit are optionally added as a sintering aid to the subsequent fine milling, for example to $d_{50}=0.3$ to 0.55 μm, using for example $ZrO_2$ beads (≤0.8 nm).

After renewed comminuting, optionally with evaporation and sieving, the disperse powder is converted into a slip for producing ceramic sheets with the addition of a quantity of K-containing compounds corresponding to the formula $$Pb_{1-(3x/2)-a}Nd_xK_{2a}V_{(x/2)-a}(Zr_{1-y}Ti_y)O_3,$$

for example $K_2CO_3$, $KCH_3COO$ or $K_2C_2O_4$ or a mixture thereof, within the limits $0.0001 \leq a \leq 0.03$ and preferably within the limits $0.002 \leq a \leq 0.0125$, use preferably being made of a nonaqueous dispersing medium, either an ethanol/toluene mixture in combination with a polyvinyl butyral binder or a methyl ethyl ketone/isopropanol mixture in combination with a polyurethane binder. In this version A, the K acceptors are incorporated in the PZT perovskite structure only after the debindering, over the course of the sintering of the sheet stack of an actuator which is provided with Cu inner electrodes.

In a version B, after the reaction, for example at 925° C. for two hours, the powder is likewise milled, for example to $d_{50} \leq 1$ μm, in an aqueous slurry, but already at this stage a quantity of K-containing compound corresponding to the formula $$Pb_{1-(3x/2)-a}Nd_xK_{2a}V_{(x/2)-a}(Zr_{1-y}Ti_y)O_3,$$

for example $K_2CO_3$, $KCH_3COO$ or $K_2C_2O_4$ or a mixture thereof, within the limits $0.0001 \leq x \leq 0.03$ and preferably within the limits $0.002 \leq a \leq 0.0125$, is added. In order to avoid losses of $K^+$ ions, the water is preferably eliminated from the slurry with the aid of a dryer, for example a drum dryer. In this version B, the $K^+$ ions are already incorporated and thereby fixed in the PZT perovskite structure during the subsequent, second reaction, for example at 950° C. for two hours. Up to 1.5 mol % PbO based on the PZT formula unit are preferably added as a sintering aid to the subsequent fine milling, for example to $d_{50}=0.3$ to 0.55 μm, using $ZrO_2$ beads (≤0.8 nm), in an aqueous slurry. In order to avoid $K^+$ ion losses on account of partial elution by hydrolysis, use is also made at this point of a dryer, for example a drum dryer, during evaporation of the water. After sieving, the finely disperse powder is converted into a sheet slip in the same way as in the version A.

In both versions, it is preferable to coordinate the parameter y, which describes the morphotropic phase boundary, and the parameter x, which has been recognized as optimal and denotes the K content, with one another as the result of an experimental investigation.

During the cofiring with Cu electrodes, minor takeup of Cu by the ceramic takes place during the sintering itself under an oxygen partial pressure which has been set in a defined manner and avoids the reduction of PbO and similarly the oxidative formation of $Cu_2O$. The Cu acceptors which are incorporated in addition to the K acceptors in the quantity range, denoted by the parameter p, of $0<p<(x/2-a)$ additionally have a promoting effect on the grain growth, and therefore a ceramic having the following general composition forms the basis of the finished multilayer actuator with Cu inner electrodes:

$$Pb_{1-(3x/2)-a-p}Nd_xK_{2a}Cu_{2p}V_{(x/2)-a-p}(Zr_{1-y}Ti_y)O_3.$$

Consequently, such additional doping with Cu acceptors within the limits $0<p<((x/2)-a)$ is also attained by the addition of $Cu_2O$ to the slip during the fine milling after the second reaction.

The powders which are produced by the version A or B are dispersed in an organic solvent with the addition of the respectively suitable binder and processed as standard to form sheets having a thickness of, for example, approximately 80 μm, and these are then printed with Cu paste and stacked up to several hundred layers and laminated. Actuators in their basic state are obtained by cutting along the edge and the Cu inner electrodes which emerge alternately in the region of the intended external contact-connection.

The organic binder constituents are preferably removed, for the purpose of avoiding uncontrolled oxidation of the Cu electrodes, with substantial exclusion of oxygen, and this is achieved, for example, with steam, to which a quantity of hydrogen is also added at the end of the debindering at up to approximately 500° C., the polymer chains being degraded by hydrolysis, depolymerization and steam reforming to form smaller molecules, which are carried out with the steam. Here, the oxygen partial pressure must not drop below a lower limit so that the reduction of PbO or PZT to form Pb is avoided. It has been identified, and documented in patents EP1240675B1 and U.S. Pat. No. 7,855,488B2, that binders based on polyurethanes are particularly well suited to debindering up to a very low residual carbon content of approximately 300 ppm on account of their hydrolytic cleavability by steam.

The sintering of the debindered actuators is carried out with a heating rate of, for example, approximately 1 K/min at, for example, 1000 to 1010° C. for a number of hours holding time under the conditions of a controlled oxygen partial pressure, it being possible for this to be set by steam and hydrogen such that the oxidation of Cu and the formation of Pb as a consequence of the reduction of PbO or PZT are avoided throughout the temperature profile. The oxygen partial pressure to be set can be calculated from thermodynamic data depending on the temperature and can be monitored by an oxygen probe.

For measurement, the actuators can be contacted by screen printing with Cu paste at the surface in the region of electrodes emerging in alternation which is intended therefor, and this external contact-connection can be burnt in in a short thermal process step under a defined oxygen partial pressure for the purpose of avoiding the oxidation of Cu.

The invention will be explained in more detail in the following exemplary embodiments.

In accordance with the general formula $$Pb_{1-(3x/2)-a-p}Nd_xK_{2a}Cu_{2p}V_{(x/2)-a-p}(Zr_{1-y}Ti_y)O_3,$$

a selection is made of the parameters $x=0.02$, $a=0.0075$, $y=0.4485$ and $p=0$, giving rise to the following composition:

$$Pb_{0.9625}Nd_{0.02}K_{0.015}V_{0.0025}(Zr_{0.5515}Ti_{0.4485})O_3.$$

First of all, the raw materials $Pb_3O_4$, $TiO_2$, $ZrO_2$ and $Nd_2O_3$, the impurity content of which has been checked and the metal content of which has been determined separately in each case, are weighed out in the corresponding molar ratio without the addition of a potassium compound (a=0) and subjected to rotary mixing with $ZrO_2$ grinding media in an aqueous slip for 24 hours. Following evaporation and sieving, the mixture is reacted at 925° C. with a holding time of two hours in a $ZrO_2$ capsule, in which case the Nd-doped PZT compound $$Pb_{0.97}Nd_{0.02}V_{0.01}(Zr_{0.5515}Ci_{0.4485})O_3$$

already largely forms.

In a version A, the reaction product is milled to a mean grain size $d_{50} \leq 1$ μm using $ZrO_2$ beads (2 mm) in an aqueous slurry, the water is removed by evaporation and, for the purpose of completing the reaction, the residue is reacted a second time, this time for two hours at 950° C. 0.8 mol % PbO based on the PZT formula unit are added as a sintering aid to the subsequent fine milling to $d_{50}=0.3$ to 0.55 μm using $ZrO_2$ beads ($\leq 0.8$ mm). After renewed evaporation and sieving, the disperse powder is converted into a slip for producing ceramic sheets with the addition of 1.5 mol % $KCH_3COO$ (a=0.0075) based on the PZT formula unit, the nonaqueous dispersing medium used being a methyl ethyl ketone/isopropanol mixture in combination with a polyurethane binder. The sheets are printed with a Cu paste, stacked up to several hundred layers and laminated and the individual actuators are obtained by being cut out from the compacted stack.

In this version A, the K acceptors are incorporated in the PZT perovskite structure after the debindering, over the course of the sintering of the sheet stack of an actuator which is provided with Cu inner electrodes. In addition, the ceramic layers take up a quantity of Cu from the inner electrodes as Cu acceptors during the sintering compaction. Where p=0.0015, this gives rise to the composition $$Pb_{0.961}Nd_{0.02}K_{0.015}Cu_{0.003}V_{0.008}(Zr_{0.5515}Ti_{0.4485})O_3$$

for the ceramic layers in the actuators.

In a version B, the reaction product obtained after the first reaction at 925° C. is likewise milled to a mean grain size $d_{50} \leq 1$ μm using $ZrO_2$ beads (2 mm) in an aqueous slurry, but already at this stage a quantity of $K_2CO_3$, $KCH_3COO$ or $K_2C_2O_4$ (a=0.0075) corresponding to the formula $$Pb_{0.9625}Nd_{0.02}K_{0.015}V_{0.0025}(Zr_{0.5515}Ti_{0.4485})O_3$$

is added. In order to avoid losses of $K^+$ ions, the water is eliminated from the slurry with the aid of a drum dryer. In this version B, the $K^+$ ions are already incorporated and thereby fixed in the PZT perovskite structure during the subsequent, second reaction, at 950° C. for two hours. 0.8 mol % PbO based on the PZT formula unit are added as a sintering aid to the subsequent fine milling to $d_{50}=0.3$ to 0.55 μm using $ZrO_2$ beads (=0.8 mm) in an aqueous slurry. In order to avoid $K^+$ ion losses on account of partial elution by hydrolysis, use is also made at this point of a drum dryer during evaporation of the water. After sieving, the finely disperse powder is converted into a sheet slip in the same way as in the version A and further processed to form actuators with Cu inner electrodes, the composition $$Pb_{0.961}Nd_{0.02}K_{0.015}Cu_{0.003}V_{0.008}(Zr_{0.5515}Ti_{0.4485})O_3$$

forming in the ceramic layer system.

It can be seen that the K acceptor doping on A sites of the PZT perovskite structure in FIG. 3A leads to an increase in the mean grain size comparable to that in the case of the Ni acceptor doping on the B sites in FIG. 3B: $d_{50}$ approximately 3 μm.

The properties compiled in table 1 show that the PZT ceramic modified by Nd/K, Cu doping on the A sites (FIG. 3A) leads to a value for the deflection parameter $d_{33}$ which is increased by 33% compared to the Nd/Cu doping on A sites and Ni doping on B sites (FIG. 3B) in the structure of an actuator. Here, an increase in the coupling parameter $k_{33}$ and also a decrease in the lost energy are achieved at the same time.

Table 1: Piezoelectric and piezomechanical properties of the actuators comprising an Nd/K, Cu-doped PZT ceramic of the composition $$Pb_{0.961}Nd_{0.02}K_{0.015}Cu_{0.003}V''_{0.008}(Zr_{0.5515}Ti_{0.4485})O_3$$

and also for actuators comprising an Nd/Cu, Ni-doped PZT ceramic of the composition $$Pb_{0.9735}Nd_{0.02}Cu_{0.003}V_{0.0035}[(Ti_{0.4485}Zr_{0.5515})_{0.995}Ni_{0.005}]O_3.$$

| Property | Nd/K, Cu-doped PZT ceramic | Nd/Cu, Ni-doped PZT ceramic |
| --- | --- | --- |
| d33 | 650 pm/V | 490 pm/V |
| ε | 2950 | 2360 |
| Modulus of elasticity $c_{33}$ | 28 GPa | 34 GPa |
| Coupling $k_{33}$ | 69.5% | 69.5% |
| Electrical energy losses | 29% | 31% |

The measurements were made on multilayer actuators having the dimensions 3.8×3.8×30 mm³. During the measurement, use was made of an electric field strength of 3 kV/mm and a mechanical prestress of 27 MPa with the spring constant for the mechanical loading of the actuator of 1 n/μm.

What is claimed is:

1. A ceramic material, comprising lead zirconate titanate, which additionally contains Nd, and K, according to the following formula:

$$Pb_{1-(3x/2)-a}Nd_xK_{2a}V_{Pb(x/2)-a}(Zr_{1-y}Ti_y)O_3,$$

within the limits $0.0001 \leq x \leq 0.06$, $0.0001 \leq a \leq 0.03$, $0.35 \leq y \leq 0.60$, preferably in the composition range.

2. The ceramic material according to claim 1, in which the lead zirconate titanate has the general composition $ABO_3$ of a perovskite lattice, wherein A represents the A sites and B represents the B sites of the perovskite lattice and Nd, and K occupy A sites in the perovskite lattice.

3. An electroceramic component comprising a ceramic material according to claim 1 or 2.

4. The electroceramic component according to claim 3, in the form of a piezoelectric actuator.

5. The piezoelectric actuator according to claim 4, comprising:
at least two layers of the ceramic material; and
an inner electrode, preferably a Cu inner electrode, between the at least two layers.

6. A method for producing a ceramic material according to claim 1 or 2, comprising the following steps:
A) producing a ceramic raw material mixture by comminuting and mixing starting materials containing Pb, Zr, Ti, Nd and oxygen;
B) introducing a K-containing compound;
C) calcining the raw material mixture; and
D) sintering to form the ceramic.

7. The method according to claim 6, wherein an additional method step A1), in which the ceramic raw material mixture is calcined and then comminuted, is carried out after method step A) and before method step B).

8. The method according to claim 6, wherein Nd is added in a range of from 0.01 to 6 mol %.

9. The method according to claim 6, wherein a K-containing compound is introduced before the calcining in method step C).

10. The method according to claim 6, wherein a K-containing compound is introduced after the calcining in method step C).

11. The method according to claim 6, wherein an additional method step C1), in which the calcined ceramic raw material mixture is comminuted and mixed with up to 1.5 mol % PbO, is carried out after method step C) and before method step D).

12. The method according to claim 6, wherein K are added in a range of from 0.01 to 6 mol %.

13. The method according to claim 6, wherein, before method step D), ceramic green sheets are formed from the ceramic raw material mixture comprising a binder.

14. A method for producing a multilayer component, comprising:
- A) producing a first ceramic raw material mixture by comminuting and mixing starting materials containing Pb, Zr, Ti, Nd and oxygen;
- B) calcining the first ceramic raw material mixture;
- C) comminuting the calcined first ceramic raw material mixture and mixing with a K-containing compound to produce a second ceramic raw material mixture;
- D) calcining the second ceramic raw material mixture;
- E) adding a binder to the ceramic raw material mixture of D;
- F) forming green sheets from the mixture of E;
- G) printing inner electrodes on the green sheets of F, the material of the inner electrodes comprising Cu,
- H) layering a multiplicity of the ceramic green sheets of G on top of one another to form a stack;
- I) consolidating the stack by lamination, as a result of which green parts are formed;
- J) debindering the green parts; and
- K) sintering the green parts, some of the Cu being transferred from the inner electrodes into the ceramic material and being incorporated therein.

15. The method according to claim 14, wherein the material of the inner electrodes comprises metallic Cu or Cu oxide.

* * * * *